(12) United States Patent
Lee et al.

(10) Patent No.: US 11,294,287 B2
(45) Date of Patent: *Apr. 5, 2022

(54) PHOTORESIST PATTERN SHRINKING COMPOSITION AND PATTERN SHRINKING METHOD

(71) Applicant: YOUNG CHANG CHEMICAL CO., LTD, Gyeongsangbuk-do (KR)

(72) Inventors: Seung Hun Lee, Daegu (KR); Seung Hyun Lee, Daegu (KR); Su Jin Lee, Daegu (KR); Gi Hong Kim, Daegu (KR)

(73) Assignee: YOUNG CHANG CHEMICAL CO., LTD., Gyeongsangbuk-Do (KR)

( * ) Notice: Subject to any disclaimer, the term of this patent is extended or adjusted under 35 U.S.C. 154(b) by 110 days.

This patent is subject to a terminal disclaimer.

(21) Appl. No.: 16/304,095

(22) PCT Filed: Jun. 20, 2017

(86) PCT No.: PCT/KR2017/006461
§ 371 (c)(1),
(2) Date: Nov. 21, 2018

(87) PCT Pub. No.: WO2017/222275
PCT Pub. Date: Dec. 28, 2017

(65) Prior Publication Data
US 2020/0110339 A1 Apr. 9, 2020

(30) Foreign Application Priority Data

Jun. 24, 2016 (KR) .................. 10-2016-0079357

(51) Int. Cl.
| | |
|---|---|
| *G03F 7/40* | (2006.01) |
| *C11D 1/72* | (2006.01) |
| *C11D 3/18* | (2006.01) |
| *C11D 3/20* | (2006.01) |
| *C11D 3/32* | (2006.01) |
| *C11D 3/43* | (2006.01) |
| *H01L 21/027* | (2006.01) |

(52) U.S. Cl.
CPC ............... *G03F 7/40* (2013.01); *C11D 1/721* (2013.01); *C11D 3/181* (2013.01); *C11D 3/201* (2013.01); *C11D 3/2065* (2013.01); *C11D 3/2068* (2013.01); *C11D 3/2072* (2013.01); *C11D 3/2093* (2013.01); *C11D 3/32* (2013.01); *C11D 3/43* (2013.01); *H01L 21/027* (2013.01)

(58) Field of Classification Search
CPC ............ G03F 7/40; G03F 7/325; G03F 7/327
See application file for complete search history.

(56) References Cited

U.S. PATENT DOCUMENTS

| | | | | |
|---|---|---|---|---|
| 2008/0248427 | A1* | 10/2008 | Thiyagarajan | C09D 139/00 430/287.1 |
| 2009/0280440 | A1* | 11/2009 | Tarutani | G03F 7/2041 430/325 |
| 2019/0137880 | A1* | 5/2019 | Lee | G03F 7/40 |
| 2020/0183284 | A1* | 6/2020 | Lee | G03F 7/038 |

FOREIGN PATENT DOCUMENTS

| | | |
|---|---|---|
| JP | 60-037552 A | 2/1985 |
| JP | 2008-166475 A | 7/2008 |
| JP | 2011-028281 A | 2/2011 |
| JP | 2011-033841 A | 2/2011 |
| JP | 4878876 B2 | 2/2012 |
| JP | 2015-079261 A | 4/2015 |
| JP | 2015-179718 A | 10/2015 |
| KR | 10-2004-0088451 A | 10/2004 |
| KR | 10-2014-0090189 A | 7/2014 |
| KR | 10-2015-0131940 A | 11/2015 |

\* cited by examiner

*Primary Examiner* — Daborah Chacko-Davis
(74) *Attorney, Agent, or Firm* — Novick, Kim & Lee, PLLC; Jae Youn Kim

(57) ABSTRACT

Provided is a composition for shrinking a photoresist pattern, which is capable of shrinking a photoresist pattern using a photoresist during the fabrication of a semiconductor, and to a method of shrinking a pattern using the composition, whereby a pattern to be formed can be shrunken in a photoresist-patterning process, thus remarkably decreasing the number of steps of a semiconductor fabrication process and reducing the fabrication time and costs.

3 Claims, 1 Drawing Sheet

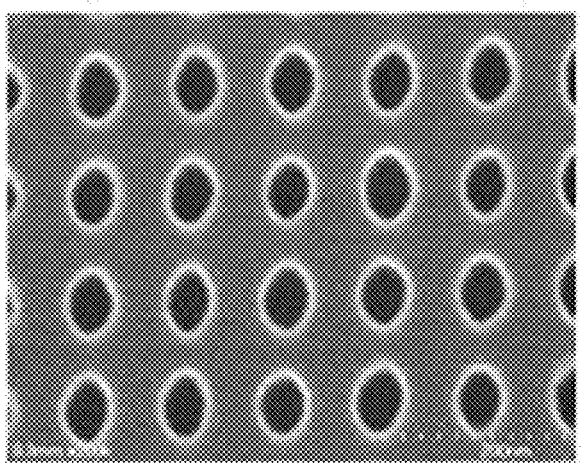
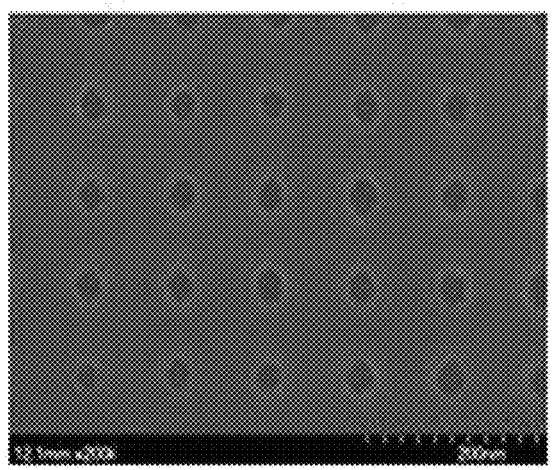

PHOTORESIST PATTERN SHRINKING COMPOSITION AND PATTERN SHRINKING METHOD

TECHNICAL FIELD

The present invention relates to a method and composition for shrinking a photoresist pattern using a photoresist during the fabrication of a semiconductor.

BACKGROUND ART

With the recent trends toward miniaturization and integration of semiconductor devices, a fine pattern is required. In the formation of such a fine pattern, increasing the fineness of a photoresist pattern through the development of an exposure device or the introduction of an additional process is regarded as efficient.

As methods of increasing the integration density of a semiconductor device and enabling the formation of a structure having dimensions in a finer nanometer range, high-resolution photoresist and photolithography processing tools are being developed.

During the fabrication of a semiconductor in the past, a pattern has conventionally been formed on a semiconductor substrate using an i-line light source at a wavelength of 365 nm, but a light source in a smaller wavelength band is necessary in order to form a finer pattern.

A lithography technique using KrF (248 nm), ArF (198 nm) and EUV (Extreme Ultra Violet, 13.5 nm) light sources has been developed and has been commercialized or is currently being commercialized for real-world application, making it possible to realize a finer wavelength. At present, it is possible to form a pattern with a space of about 30 nm to 50 nm, and there is a need for a smaller and more integrated technology, which requires pattern shrinkage to a finer pattern size (5-nm level).

The formation of a photoresist pattern includes a positive tone development (PTD) process for forming a pattern using an alkaline developing solution and a negative tone development (NTD) process for forming a pattern using an organic solvent. The process of forming a pattern using a positive tone developing solution includes selectively dissolving and removing the exposed region of a photoresist film using an alkaline developing solution, and the process of forming a pattern using a negative tone developing solution facilitates pattern formation and removes the unexposed portion and is thus more effectively able to form a photoresist pattern, compared to pattern formation using the positive tone developing solution.

Various processes for pattern shrinkage have been proposed in order to further miniaturize the pattern formed by the above positive tone development or negative tone development resist patterning technique, and examples thereof include a resist flow process and a RELACS (Resolution Enhancement Lithography Assisted by Chemical Shrink) process.

The resist flow process includes performing exposure and development to form a photoresist pattern having the same resolution as an exposure device, and then applying heat energy at a temperature equal to or higher than the glass transition temperature of a photoresist to thus enable thermal flow of the photoresist. Here, the already-formed pattern is subjected to thermal flow in a direction of decreasing the original size thereof using the supplied heat energy, finally obtaining a fine pattern required for the integration process. When the resist flow process is introduced in this way, a fine pattern having a resolution equal to or less than the resolution of the exposure device may be formed. However, in the resist flow process, the flow of the photoresist may rapidly occur at a certain temperature, particularly at a temperature equal to or higher than the glass transition temperature of the photoresist resin, and thus the profile of the pattern may warp or collapse, and furthermore, an overflow phenomenon, in which the pattern is embedded, is caused when excessive flow occurs, which is undesirable. This is because temperature control is inappropriate owing to the very sensitive reaction of most photoresists to the applied heat or because excessive thermal flow occurs when the flow time is longer than the preset value. This phenomenon takes place because the amount of polymer that may flow in the upper, middle, and lower layers of the formed contact hole is different. Since the amount of the polymer that may flow in the upper and lower layers is smaller than that in the middle layer, the flow is less when the same heat energy is transferred, and thus the pattern formed after the flow becomes warped. With the goal of solving these problems, methods of increasing the temperature uniformity of a bake oven for applying heat or of precisely adjusting the time of baking in the bake oven are conventionally used. The extent of improvement of the oven process is not sufficient to solve the problem of overflow, and the problem in which the shape of the warped pattern cannot be improved only through oven control still remains.

The RELACS process (L. Peters. "Resists Join Sub-Revolution", Semiconductor International, 1999. 9) enables the formation of a fine pattern by again forming a typical contact hole photoresist pattern having a contact opening having a size larger than the final contact hole pattern size to be formed. Thereafter, a water-soluble polymer is applied on the initial photoresist pattern formed as described above. The water-soluble polymer reacts with the photoresist pattern to give an insoluble crosslinking layer along the surface thereof. Thereafter, the photoresist pattern is cleaned to remove an unreacted polymer, whereby the effective size of the photoresist pattern is increased by the crosslinking layer, and thus the space size in the contact opening or line/space (L/S) pattern is reduced. Although the above process has an advantage of uniformly reducing the pattern size, incomplete removal of the water-soluble polymer causes development residue such as spots or scum to remain on the pattern, and such development residue increases the likelihood of occurrence of defects in the final device in a subsequent etching process, undesirably deteriorating yield and reliability. Furthermore, two-step cleaning of the wafer, including cleaning with a first solution and then with water, is performed, and thus the amount of development residue remaining on the wafer may be reduced. In this case, however, the process becomes complicated and processing costs may increase, which is undesirable.

Meanwhile, in order to solve the problems in the conventional method of forming a fine pattern, work capable of realizing a finer pattern has been actively carried out through research on the development of a new process, and the development of a technique for shrinking a photoresist pattern is required.

DISCLOSURE

Technical Problem

Accordingly, the present invention is intended to provide a novel composition for shrinking a pattern and a method of shrinking a pattern using the composition, in which the conventional complicated process for shrinking a photoresist pattern during the fabrication of a semiconductor may be remarkably simplified, thus reducing the fabrication time and costs.

In addition, the present invention is intended to provide a pattern-shrinking composition and method capable of freely adjusting the size of the pattern to be shrunken.

Technical Solution

Therefore, a preferred embodiment of the present invention provides a processing solution composition for shrinking a photoresist pattern, comprising 1 to 100 wt % of a pattern-shrinking material for shrinking a photoresist pattern and 0 to 99 wt % of a solvent.

The processing solution composition of the present invention may further comprise 0 to 2 wt % of a surfactant.

In the above embodiment, the pattern-shrinking material for shrinking a photoresist pattern may be selected from the group consisting of an alcohol and a derivative thereof, an amide-based solvent, a ketone-based solvent, an ether-based solvent, an ester-based solvent, a hydrocarbon-based solvent, and a mixture thereof.

In the above embodiment, the solvent is not particularly limited, so long as it does not dissolve a resist pattern, and the solvent may be efficiently mixed with the pattern-shrinking material as above, and a solution including a typical organic solvent may be used. The solvent may be selected from the group consisting of monohydric alcohols, such as 1-pentanol, 2-pentanol, 1-hexanol, 1-heptanol, 1-octanol, 2-hexanol, 2-heptanol, 2-octanol, 3-hexanol, 3-octanol, 4-octanol, 1-butanol, 2-butanol, 3-methyl-1-butanol, and tert-butyl alcohol, ester-based solvents, such as butyl acetate, amyl acetate, ethyl-3-ethoxypropionate, 3-methoxybutylacetate, 3-methyl-3-methoxybutylacetate, butyl formate, propyl formate, ethyl lactate, and butyl lactate, and mixtures thereof.

In the above embodiment, the surfactant may be a nonionic surfactant.

In the above embodiment, the nonionic surfactant may be selected from the group consisting of polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene laurylethers, polyoxyethylene sorbitans, and mixtures thereof.

Another preferred embodiment of the present invention provides a method of shrinking a pattern, comprising continuously subjecting the composition prepared under the above conditions to (1) dispensing in a predetermined amount, (2) puddling for a predetermined period of time and then (3) spin drying, after a photoresist development process.

As for patterning with a photoresist, a typical positive photoresist process includes coating with a photoresist solution, soft-baking, exposure, post-exposure baking (PEB), development, and rinsing with deionized water (DI). A negative photoresist process includes coating with a photoresist solution, soft-baking, exposure, post-exposure baking (PEB), and development with each developing solution, which is the same procedure as in the typical positive photoresist process. Subsequently, in the positive photoresist process, water rinsing is finally performed to remove the developing solution and the development residue, whereas in the negative tone photoresist process, since water and the developing solution cannot be mixed and thus water rinsing is impossible, additional developing solution is used in lieu of the water-rinsing step, or a rinse liquid in the form of an organic solvent usable in lieu of water is used to remove residue.

The cited invention (Korean Patent Application Publication No. 10-2004-0088451) discloses a method of shrinking a pattern, in which coating and baking are performed using a RELACS material, and the remaining RELACS material is removed to form a primary fine contact hole, over which a crosslinkable organic material is then applied to form a crosslinkable organic layer, followed by applying a material capable of crosslinking with an acid generated from the crosslinkable organic layer to form a shrink support film, performing a baking process so that the crosslinkable organic layer and the shrink support film are crosslinked to form a crosslinking layer, and removing the shrink support film, which is not crosslinked but remains, thereby forming a final fine contact hole. In contrast, the present invention is capable of shrinking a pattern merely by puddling a wafer subjected to rinsing treatment using a pattern-shrinking material without performing coating and baking.

When the method of the present invention is applied, the existing 50 nm pattern may be shrunken to less than 5 nm, and after the dispensing process, the wafer is fixed and puddled, making it possible to serve for both a positive resist and a negative resist.

Advantageous Effects

As for a composition for shrinking a photoresist pattern and a method of shrinking a pattern using the composition according to the present invention, a pattern to be formed can be shrunken in a photoresist-patterning process, thus remarkably decreasing the number of steps of a semiconductor fabrication process and making it possible to expect a reduction in fabrication time and costs.

BRIEF DESCRIPTION OF DRAWING

FIG. 1 shows scanning electron microscopy images of photoresist patterns of Comparative Test Example 1 and Test Example 1.

BEST MODE

Hereinafter, a detailed description will be given of the present invention.

The present invention pertains to a composition and method for shrinking a pattern in a photoresist-patterning process.

In the present invention, the composition for shrinking a pattern comprises 1 to 100 wt % of a pattern-shrinking material for shrinking a photoresist pattern, 0 to 99 wt % of a solvent, and 0 to 2 wt % of a surfactant.

In the present invention, the method of shrinking a pattern includes dispensing at a speed of 5 to 50 mL/s for 1 to 20 sec, puddling for 5 to less than 120 sec, and spin drying.

Generally, during the fabrication of a semiconductor, a pattern is shrunken in a manner in which an appropriate pattern-shrinking material (RELACS) is applied on a semiconductor substrate having a predetermined pattern, and is then baked to form a crosslinking layer between the RELACS layer and the photoresist film, after which the RELACS layer, which is not crosslinked but remains, is removed using an appropriate cleaning material.

The present invention pertains to a processing solution composition comprising a pattern-shrinking material, which is capable of shrinking a pattern through dispensing, puddling for a predetermined period of time and then spin drying, and to a method of shrinking a pattern using the composition.

The pattern-shrinking material may include at least one selected from among an alcohol or a derivative thereof, an amide-based solvent, a ketone-based solvent, an ether-based solvent, an ester-based solvent and a hydrocarbon-based solvent.

Specific examples of the alcohol or the derivative thereof may include C1-C5 alcohols and derivatives thereof, such as methanol, ethanol, 2-butoxy ethanol, N-propanol, 2-propanol, 1-butoxy-2-propanol, 2-methyl-2-propanol, 1-butanol, 2-butanol, 2-methyl-2-butanol, 3-methyl-1-butanol, tert-butyl alcohol, 1-pentanol, 2-pentanol, 3-pentanol, 2-methyl-1-pentanol, 2-methyl-3-pentanol, 2,3-dimethyl-3-pentanol, and 4-methyl-2-pentanol.

Specific examples of the amide-based solvent may include C1-C10 amide-based solvents, such as N-methyl-2-pyrrolidone, N,N-dimethylacetamide, N,N-dimethylformamide, and 1,3-dimethyl-2-imidazolidinone.

Specific examples of the ketone-based solvent may include C1-C10 ketone-based solvents, such as 1-octanone, 2-octanone, 1-nonanone, 2-nonanone, 1-hexanone, 2-hexanone, 4-heptanone, diisobutyl ketone, cyclohexanone, methylcyclohexanone, methyl ethyl ketone, methyl isobutyl ketone, diacetonyl alcohol, and acetyl carbitol.

Specific examples of the ether-based solvent may include C1-C10 ether-based solvents, such as ethylene glycol, propylene glycol, diethylene glycol, triethylene glycol, monomethylether, methoxymethyl butanol, diethylether, ethylene glycol monomethylether, propylene glycol monomethylether, propylene glycol monoethylether, diethylene glycol monomethylether, and triethylene glycol monoethylether.

Specific examples of the ester-based solvent may include C1-C10 ester-based solvents, such as propylene glycol monomethylether acetate, ethylene glycol monoethylether acetate, diethylene glycol monobutylether acetate, and diethylene glycol monoethylether acetate.

Specific examples of the hydrocarbon-based solvent may include C1-C10 hydrocarbon-based solvents, such as pentane, hexane, octane, and decane.

The amount of the pattern-shrinking material may be 1 to 100 wt %.

The solvent is not particularly limited, so long as it does not dissolve the resist pattern, and the solvent may be efficiently mixed with the above pattern-shrinking material, and a solution including a typical organic solvent may be used. Particularly preferable examples of the solvent may include monohydric alcohols, such as 1-pentanol, 2-pentanol, 1-hexanol, 1-heptanol, 1-octanol, 2-hexanol, 2-heptanol, 2-octanol, 3-hexanol, 3-octanol, 4-octanol, 1-butanol, 2-butanol, 3-methyl-1-butanol, and tert-butyl alcohol, and ester-based solvents, such as butyl acetate, amyl acetate, ethyl-3-ethoxypropionate, 3-methoxybutylacetate, 3-methyl-3-methoxybutylacetate, butyl formate, propyl formate, ethyl lactate, and butyl lactate.

The amount of the solvent may be 0 to 99 wt %.

The surfactant may be any one or a mixture of two or more selected from the group consisting of nonionic surfactants, such as polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene laurylethers, and polyoxyethylene sorbitans.

The surfactant plays a role in decreasing surface tension to thus increase spreadability or penetrability, thus aiding in shrinking a pattern.

The amount of the surfactant may be 0 to 2 wt %.

When the composition for shrinking a photoresist pattern is applied to the processing method, it is essential to set an appropriate process and a processing time because the photoresist formed on a normal pattern has to be finely shrunken to the level of ones of nm. The critical shrinkage rate upon pattern shrinking is 10% or more (5 nm or more in a 50 nm pattern). Although there is a difference depending on the kind of processing solution, when the puddle time is below 5 sec in the process of shrinking a photoresist pattern on a 300 mm wafer, the shrinkage effect is low and thus there is almost no pattern shrinkage effect. On the other hand, when the puddle time is above 120 sec, the processing time is increased and excessive shrinkage is caused, and thus pattern CDU becomes poor. Hence, the puddle time is preferably set to the range of 5 sec to 120 sec.

In a typical photoresist-patterning process, a photoresist photosensitive to ArF is applied through spin coating at 1500 rpm on a 300 mm silicon wafer using a spin coater, dried (SB: Soft Baking) on a hot plate at 120° C. for 60 sec, exposed using an exposure machine for generating ArF, dried (PEB: Post-Exposure Baking) on a hot plate at 120° C. for 60 sec, and developed for 30 sec using a developing solution.

In the present invention, after the typical photoresist-patterning process, the processing solution for shrinking a photoresist pattern is dispensed at 100 rpm at a speed of 15 mL/s for 10 sec, and puddled for 20 sec, followed by rotating the wafer at 4000 rpm for 20 sec, thereby completing the formation of a photoresist pattern.

The above process is described by way of example, and the processing time is not limited thereto.

As described hereinbefore, the composition for shrinking a photoresist pattern and the processing method using the composition enable a small pattern surface to be appropriately shrunken, whereby a high processing margin may be provided during subsequent etching or implanting processes, ultimately increasing production yield and thus reducing fabrication costs.

A better understanding of the present invention will be given through the following examples and comparative example, in which the examples are set forth merely to illustrate the present invention, but are not to be construed as limiting the scope thereof.

Mode for Invention

Example 1

A composition for shrinking a photoresist pattern, comprising 20 wt % of ethanol and 80 wt % of 2-heptanol, was prepared as follows.

Ethanol was added with 2-heptanol, stirred for 6 hr, and passed through a 0.02 µm filter, thus preparing a composition for shrinking a photoresist pattern.

Examples 2 to 28

Respective compositions for shrinking a photoresist pattern were prepared in the same manner as in Example 1 using the components in the amounts shown in Table 1 below.

Comparative Example

Butyl acetate, used as a final cleaning solution for a negative tone development process during the fabrication of a semiconductor device, was provided.

Test Example 1

A photoresist photosensitive to ArF was applied through spin coating on a 300 mm silicon wafer at 1500 rpm using a spin coater, dried (SB: Soft Baking) on a hot plate at 120° C. for 60 sec, exposed using an exposure machine for generating ArF, dried (PEB: Post-Exposure Baking) on a hot plate at 120° C. for 60 sec, and developed (negative tone development) for 30 sec using a negative tone developing solution (butyl acetate). Thereafter, the composition for shrinking the pattern prepared in Example 1 was dispensed at 100 rpm at a speed of 15 mL/s for 10 sec and was then puddled for 20 sec, and the wafer was rotated at 4000 rpm for 20 sec, thereby completing the formation of a photoresist pattern. Here, the formed pattern size was 50 nm.

Test Examples 2 to 59

Respective patterns were formed in the same manner as in Test Example 1 using the compositions of Examples 1 to 28, except for the puddle time in the pattern-shrinking process.

Comparative Test Examples 1 and 2

Respective patterns were formed in the same manner as in Test Example 1 using butyl acetate of Comparative Example as the processing solution, except for the puddle time in the pattern-shrinking process.

For the silicon wafers having the patterns of Test Examples 1 to 59 and Comparative Test Examples 1 and 2, pattern CD (Critical Dimension) sizes were measured, and the extent of shrinkage of the pattern was determined. The results are shown in Table 2 below.

(1) CD (Critical Dimension) size

The difference between the X-axis and the Y-axis of the pattern was measured using a scanning electron microscope (FE-SEM, Hitachi), and thus the CD values were determined. After treatment, a 50 nm hole pattern was measured in the present test.

TABLE 1

| | Pattern-shrinking material | | Solvent | | Surfactant | |
|---|---|---|---|---|---|---|
| | Name | Amount (wt %) | Name | Amount (wt %) | Name | Amount (wt %) |
| Example 1 | Ethanol | 20 | 2-heptanol | 80 | Polyoxyethylene nonylphenylether | |
| Example 2 | Ethanol | 50 | 2-heptanol | 50 | Polyoxyethylene nonylphenylether | |
| Example 3 | Ethanol | 80 | 2-heptanol | 20 | Polyoxyethylene nonylphenylether | |
| Example 4 | Ethanol | 20 | 2-heptanol | 79.9 | Polyoxyethylene nonylphenylether | 0.1 |
| Example 5 | Ethanol | 20 | 2-heptanol | 78 | Polyoxyethylene nonylphenylether | 2 |
| Example 6 | 2-pentanol | 20 | 2-heptanol | 80 | Polyoxyethylene nonylphenylether | |
| Example 7 | 2-pentanol | 50 | 2-heptanol | 50 | Polyoxyethylene nonylphenylether | |
| Example 8 | 2-pentanol | 80 | 2-heptanol | 20 | Polyoxyethylene nonylphenylether | |
| Example 9 | Acetamide | 20 | 2-heptanol | 80 | Polyoxyethylene nonylphenylether | |
| Example 10 | Acetamide | 80 | 2-heptanol | 20 | Polyoxyethylene nonylphenylether | |
| Example 11 | 4-4-methoxy-2-phenyl glycinamide | 20 | 2-heptanol | 80 | Polyoxyethylene nonylphenylether | |
| Example 12 | 4-4-methoxy-2-phenyl glycinamide | 80 | 2-heptanol | 20 | Polyoxyethylene nonylphenylether | |
| Example 13 | Methyl ethyl ketone | 20 | 2-heptanol | 80 | Polyoxyethylene nonylphenylether | |
| Example 14 | Methyl ethyl ketone | 80 | 2-heptanol | 20 | Polyoxyethylene nonylphenylether | |
| Example 15 | Acetyl carbitol | 20 | 2-heptanol | 80 | Polyoxyethylene nonylphenylether | |
| Example 16 | Acetyl carbitol | 80 | 2-heptanol | 20 | Polyoxyethylene nonylphenylether | |
| Example 17 | Ethylene glycol | 20 | 2-heptanol | 80 | Polyoxyethylene nonylphenylether | |
| Example 18 | Ethylene glycol | 80 | 2-heptanol | 20 | Polyoxyethylene nonylphenylether | |
| Example 19 | Triethylene glycol monoethyl ether | 20 | 2-heptanol | 80 | Polyoxyethylene nonylphenylether | |
| Example 20 | Triethylene glycol monoethyl ether | 80 | 2-heptanol | 20 | Polyoxyethylene nonylphenylether | |
| Example 21 | Methyl acetate | 20 | 2-heptanol | 80 | Polyoxyethylene nonylphenylether | |

TABLE 1-continued

| | Pattern-shrinking material | | Solvent | | Surfactant | |
|---|---|---|---|---|---|---|
| | Name | Amount (wt %) | Name | Amount (wt %) | Name | Amount (wt %) |
| Example 22 | Methyl acetate | 80 | 2-heptanol | 20 | Polyoxyethylene nonylphenylether | |
| Example 23 | Diethylene glycol monobutyl ether acetate | 20 | 2-heptanol | 80 | Polyoxyethylene nonylphenylether | |
| Example 24 | Diethylene glycol monobutyl ether acetate | 80 | 2-heptanol | 20 | Polyoxyethylene nonylphenylether | |
| Example 25 | Pentane | 20 | 2-heptanol | 80 | Polyoxyethylene nonylphenylether | |
| Example 26 | Pentane | 80 | 2-heptanol | 20 | Polyoxyethylene nonylphenylether | |
| Example 27 | Decane | 20 | 2-heptanol | 80 | Polyoxyethylene nonylphenylether | |
| Example 28 | Decane | 80 | 2-heptanol | 20 | Polyoxyethylene nonylphenylether | |
| Comparative Example | Butyl acetate | 100 | | | | |

TABLE 2

| | Composition | Puddle time (sec) | Pattern CD Size (nm) | Shrinkage rate (%) (based on non-treatment group) |
|---|---|---|---|---|
| Test Example 1 | Example 1 | 20 | 35.2 | 29.6 |
| Test Example 2 | Example 1 | 120 | 22.0 | 56.0 |
| Test Example 3 | Example 2 | 20 | 24.1 | 51.8 |
| Test Example 4 | Example 2 | 120 | 10.2 | 79.6 |
| Test Example 5 | Example 3 | 20 | 14.9 | 70.2 |
| Test Example 6 | Example 3 | 120 | 4.5 | 91.0 |
| Test Example 7 | Example 4 | 20 | 34.8 | 30.4 |
| Test Example 8 | Example 4 | 120 | 21.9 | 56.2 |
| Test Example 9 | Example 5 | 20 | 34.7 | 30.6 |
| Test Example 10 | Example 5 | 120 | 21.7 | 56.6 |
| Test Example 11 | Example 6 | 20 | 37.0 | 26.0 |
| Test Example 12 | Example 6 | 120 | 23.5 | 53.0 |
| Test Example 13 | Example 7 | 20 | 34.2 | 31.6 |
| Test Example 14 | Example 7 | 120 | 20.2 | 59.6 |
| Test Example 15 | Example 8 | 20 | 16.0 | 68.0 |
| Test Example 16 | Example 8 | 120 | 5.4 | 89.2 |
| Test Example 17 | Example 9 | 20 | 38.8 | 22.4 |
| Test Example 18 | Example 9 | 120 | 25.2 | 49.6 |
| Test Example 19 | Example 10 | 20 | 27.7 | 44.6 |
| Test Example 20 | Example 10 | 120 | 6.6 | 86.8 |
| Test Example 21 | Example 11 | 20 | 40.2 | 19.6 |
| Test Example 22 | Example 11 | 120 | 31.2 | 37.6 |
| Test Example 23 | Example 12 | 20 | 22.8 | 54.4 |
| Test Example 24 | Example 12 | 120 | 8.8 | 82.4 |
| Test Example 25 | Example 13 | 20 | 36.8 | 26.4 |
| Test Example 26 | Example 13 | 120 | 23.2 | 53.6 |
| Test Example 27 | Example 14 | 20 | 19.2 | 61.6 |
| Test Example 28 | Example 14 | 120 | 5.6 | 88.8 |
| Test Example 29 | Example 15 | 20 | 37.2 | 25.6 |
| Test Example 30 | Example 15 | 120 | 24.3 | 51.4 |
| Test Example 31 | Example 16 | 20 | 26.3 | 47.4 |
| Test Example 32 | Example 16 | 120 | 10.8 | 78.4 |
| Test Example 33 | Example 17 | 20 | 39.5 | 21.0 |
| Test Example 34 | Example 17 | 120 | 23.8 | 52.4 |
| Test Example 35 | Example 18 | 20 | 26.2 | 47.6 |
| Test Example 36 | Example 18 | 120 | 9.7 | 80.6 |
| Test Example 37 | Example 19 | 20 | 38.1 | 23.8 |
| Test Example 38 | Example 19 | 120 | 22.2 | 55.6 |
| Test Example 39 | Example 20 | 20 | 23.1 | 53.8 |
| Test Example 40 | Example 20 | 120 | 9.2 | 81.6 |
| Test Example 41 | Example 21 | 20 | 39.5 | 21.0 |
| Test Example 42 | Example 21 | 120 | 25.2 | 49.6 |
| Test Example 43 | Example 22 | 20 | 28.4 | 43.2 |
| Test Example 44 | Example 22 | 120 | 13.7 | 72.6 |
| Test Example 45 | Example 23 | 20 | 38.5 | 23.0 |
| Test Example 46 | Example 23 | 120 | 22.9 | 54.2 |
| Test Example 47 | Example 24 | 20 | 24.1 | 51.8 |
| Test Example 48 | Example 24 | 120 | 6.2 | 87.6 |
| Test Example 49 | Example 25 | 20 | 38.4 | 23.2 |
| Test Example 50 | Example 25 | 120 | 21.6 | 56.8 |
| Test Example 51 | Example 26 | 20 | 22.7 | 54.6 |
| Test Example 52 | Example 26 | 120 | 6.9 | 86.2 |
| Test Example 53 | Example 27 | 5 | 44.9 | 10.2 |
| Test Example 54 | Example 27 | 10 | 43.9 | 12.2 |
| Test Example 55 | Example 27 | 15 | 43.3 | 13.4 |
| Test Example 56 | Example 27 | 20 | 42.8 | 14.4 |
| Test Example 57 | Example 27 | 120 | 28.5 | 43.0 |
| Test Example 58 | Example 28 | 20 | 29.5 | 41.0 |
| Test Example 59 | Example 28 | 120 | 15.7 | 68.6 |
| Comparative Test Example 1 | Comparative Example | Non-treatment group | 50.0 | 0.0 |
| Comparative Test Example 2 | Comparative Example | 20 | 47.0 | 6.0 |

In the above Examples and Test Examples, the following can be confirmed.

The pattern size can be concluded to be variously controlled by adjusting the amount of the pattern-shrinking material, such as the alcohol or derivative thereof, amide-based solvent, ketone-based solvent, ether-based solvent, ester-based solvent or hydrocarbon-based solvent, or the puddle time in the process according to the present invention.

The invention claimed is:

1. A composition for shrinking a photoresist pattern on a wafer, the composition comprising:
    20 to 80 wt % of a pattern-shrinking material for shrinking the photoresist pattern on the wafer;
    20 to 80 wt % of a solvent; and
    0.01 to 2 wt % of a surfactant,
    wherein the surfactant is polyoxyethylene nonylphenylether,
    wherein the pattern-shrinking material is any one or a mixture of two or more selected from the group consisting of acetyl carbitol as a C1-C10 ketone-based solvent; ethylene glycol or triethylene glycol monoethylether as a C1-C10 ether-based solvent; and diethylene glycol monobutylether acetate as a C1-C10 ester-based solvent, and wherein the solvent is 2-heptanol.

2. A method of shrinking a photoresist pattern on a wafer, the method comprising:
(1) dispensing a composition for shrinking the photoresist pattern on the photoresist pattern on the wafer;
(2) puddling for a predetermined period of time; and
(3) spin drying,
wherein the composition for shrinking the photoresist pattern comprises:
20 to 80 wt % of a pattern-shrinking material for shrinking the photoresist pattern on the wafer;
20 to 80 wt % of a solvent; and
0.01 to 2 wt % of a surfactant,
wherein the surfactant is polyoxyethylene nonylphenylether,
wherein the pattern-shrinking material is any one or a mixture of two or more selected from the group consisting of acetyl carbitol as a C1-C10 ketone-based solvent; ethylene glycol or triethylene glycol monoethylether as a C1-C10 ether-based solvent; and diethylene glycol monobutylether acetate as a C1-C10 ester-based solvent, and
wherein the solvent is 2-heptanol.

3. The method of claim 2, wherein the puddling is performed for 20 to 120 seconds.

* * * * *